(12) United States Patent
Van Schaijk et al.

(10) Patent No.: US 7,419,875 B2
(45) Date of Patent: Sep. 2, 2008

(54) SHALLOW TRENCH ISOLATION IN FLOATING GATE DEVICES

(75) Inventors: Robertus Theodorus Fransiscus Van Schaijk, Leuven (BE); Michiel Jos Van Duuren, Leuven (BE)

(73) Assignee: NXP B.V., Eindhoven (NL)

( * ) Notice: Subject to any disclaimer, the term of this patent is extended or adjusted under 35 U.S.C. 154(b) by 386 days.

(21) Appl. No.: 10/537,518

(22) PCT Filed: Oct. 31, 2003

(86) PCT No.: PCT/IB03/04949

§ 371 (c)(1), (2), (4) Date: Jun. 3, 2005

(87) PCT Pub. No.: WO2004/053992

PCT Pub. Date: Jun. 24, 2004

(65) Prior Publication Data

US 2006/0118861 A1 Jun. 8, 2006

(30) Foreign Application Priority Data

Dec. 6, 2002 (EP) .................................. 02080070

(51) Int. Cl.
  *H01L 21/336* (2006.01)

(52) U.S. Cl. ............................... 438/257; 257/E21.179
(58) Field of Classification Search ................ 438/261, 438/266, 257
See application file for complete search history.

(56) References Cited

U.S. PATENT DOCUMENTS

| 6,222,225 B1 * | 4/2001 | Nakamura et al. .......... 257/315 |
| 6,391,722 B1 | 5/2002 | Koh |
| 2002/0093073 A1 | 7/2002 | Mori et al. |

* cited by examiner

*Primary Examiner*—W. David Coleman
(74) *Attorney, Agent, or Firm*—Peter Zawilski

(57) ABSTRACT

The present invention provides a method for manufacturing a floating gate type semiconductor device on a substrate having a surface (2), and a device thus manufactured. The method comprises:—forming, on the substrate surface, a stack comprising an insulating film (4), a first layer of floating gate material (6) and a layer of sacrificial material (8),—forming at least one isolation zone (18) through the stack and into the substrate (2), the first layer of floating gate material (6) thereby having a top surface and side walls (26),—removing the sacrificial material (8), thus leaving a cavity (20) defined by the isolation zones (18) and the top surface of the first layer of floating gate material (6), and filling the cavity (20) with a second layer of floating gate material (22), the first layer of floating gate material (6) and the second layer of floating gate material (22) thus forming together a floating-gate (24).

3 Claims, 4 Drawing Sheets

SHALLOW TRENCH ISOLATION IN FLOATING GATE DEVICES

The present invention relates to a method for making floating gate (FG) devices, usable for manufacturing ultrahigh-density non-volatile memories (NVMs), as well as to the devices themselves. More specifically the invention relates to a method for manufacturing FG devices comprising self-aligned shallow trench isolations (SA STI) as well as to FG devices themselves. Some examples of NVMs include an EPROM, an EEPROM and a flash memory cell.

NVMs are used in a wide variety of commercial and military electronic devices and equipment, such as e.g. hand-held telephones, radios and digital cameras. The market for these electronic devices continues to demand devices with a lower voltage, lower power consumption and a decreased chip size.

Flash memories or flash memory cells comprise a MOSFET with a (or a plurality of) floating gate(s) (FG) between a control gate (CG) and a channel region, the FG(s) and the CG being separated by a thin dielectric layer. With the improvement of fabrication technologies, the FG size and the space between FGs has been reduced to sub-micrometer scale. These devices are basically miniature EEPROM cells in which electrons (or holes) are injected through an oxide barrier in a FG. Charges stored in the FG modify the device threshold voltage. In this way, data is stored. The CG controls the FG. The FG to CG coupling ratio, which is related to the areal overlap between the FG and the CG, should be as great as possible. It affects the read/write speed of the flash memory. Furthermore, the better the coupling ratio, the more the required operation voltage of the memory cell can be reduced.

It is a disadvantage of known FG memory devices that they have a small coupling ratio between the FG and the CG.

It is known from U.S. Pat. No. 6,403,421 and IEDM Tech. Dig. 1994, pp. 61-64 to make a FG type semiconductor NVM device having a SA-STI cell structure. The fabrication of the SA-STI cell uses conventional techniques, and is illustrated e.g. in FIGS. 4 and 5 of U.S. Pat. No. 6,403,421. First, a stacked layer of a gate oxide, a FG polysilicon and a cap oxide is formed on top of a semiconductor substrate. Next, a trench isolation region is defined by patterning these three layers, followed by trench etching and filling with LP-CVD $SiO_2$. Subsequently, the LP-CVD $SiO_2$ is etched back until the sidewall of the FG polysilicon is exposed. After that, an interpoly dielectric (ONO) and a control gate polysilicon are formed, followed by stacked gate patterning.

It is a disadvantage of the above process that the FG and the STI patterning are carried out with the same resist mask, i.e. that the FG polysilicon and the trench in the silicon substrate are etched together. During this etch, enough resist, or thus a thick resist layer, should be present on top of the structure in order not to attack the FG polysilicon where it is not to be removed. If the resist has disappeared during the STI etch, the silicon substrate and the polysilicon FG will be etched at the same rate, thus deteriorating the FG. Therefore, a thick resist layer is needed. However, using thicker resist layers leads to larger dimensions of devices, because it is impossible to expose devices with smaller dimensions if thick layers are on top. Therefore, the simultaneous etching of FG polysilicon and STI zones in the substrate is not compatible with the continuing down scaling of device dimensions.

It is an object of the present invention to provide a method for making FG semiconductor devices, which method can easily be used when device dimensions are further downscaled.

The above objective is accomplished by a method and a device according to the present invention.

The present invention provides a method for manufacturing a floating gate type semiconductor device on a substrate having a surface. The method comprises:

forming, on the substrate surface, a stack comprising an insulating film, preferably a tunnel insulating layer, a first layer of floating gate material and a layer of sacrificial material, forming at least one isolation zone, such as for example a shallow trench isolation (STI) region, through the stack and into the substrate, the first layer of floating gate material thereby having a top surface and side walls, removing the sacrificial material, thus leaving a cavity defined by the isolation zones and the top surface of the first layer of floating gate material, and filling the cavity with a second layer of floating gate material, the first layer of floating gate material and the second layer of floating gate material thus forming together a floating gate.

It is an advantage of the above method according to the present invention, that the layer of sacrificial material may be used as a hard mask during prosecution of the method. A masking layer such as a resist layer may be used for making a hard mask out of the layer of sacrificial material, or thus for selectively removing parts of the layer of sacrificial material. This masking layer does not need to be thick, which is an advantage when downscaling the dimensions of semiconductor devices formed by the above method. If the masking layer were completely removed when removing the layer of sacrificial material, then part of the layer of sacrificial material which was intended to be left would be removed as well, but no functional materials of the device to be formed would get damaged or thinned. Furthermore, by filling the cavity, formed by removing the thick layer of sacrificial material, with a second layer of floating gate material, so that the second layer of floating gate material and the first layer of floating gate material together form the floating gate, a higher floating gate can be obtained compared to prior art floating gate devices. As later on (see below) a control gate is formed, not only at the top of the floating gate, but also at its side walls, a higher coupling between the floating gate and the control gate is obtained, as the overlap area involved between the floating gate and the coupling gate is increased.

After filling the cavity, the isolation zones may be partially removed so as to expose part of the sidewalls of the floating gate. A control gate may be formed over the floating gate, preferably after having formed an interlayer dielectric between the floating gate and the control gate. By exposing the sidewalls of the floating gate before forming the control gate, the coupling between the floating gate and the control gate is increased. When removing the isolation zones, according to an embodiment, this is done so as to completely expose the sidewalls of the second layer of floating gate material and part of the sidewalls of the first layer of floating gate material. This has the advantage that a larger coupling between the floating gate and the control gate is obtained.

A method according to the present invention may furthermore comprise forming a protection layer between the first layer of floating gate material and the layer of sacrificial material. Such a protection layer protects the floating gate layer during removal of the layer of sacrificial material.

The sacrificial material used may for example be a nitride layer, an oxide layer or a silicon carbide layer. This list, however, is not exhaustive.

A method according to the present invention may furthermore comprise, after filling the cavity, removing floating gate material present outside the cavity. When this is done, the top surface of the newly formed floating gate is at the same level as the top surface of the isolation zones. The floating gate material may be removed by polishing, for example by chemical mechanical polishing (CMP).

Preferably, the first layer of floating gate material and the second layer of floating gate material, together forming the floating gate of the device, are the same material.

The present invention also provides a floating gate type semiconductor device. Such device comprises:

a substrate having a surface, a stack of layers on the surface comprising an insulating film, a first layer of floating gate material, and a second layer of separately deposited floating gate material on said first layer of floating gate material, the first and second layers forming together a floating gate.

The fact that both layers of floating gate material, together forming a floating gate, have been deposited separately, is visible in the final device, for example by means of an electron microscope or any other suitable imaging device. If implanted floating gate material, e.g. implanted polysilicon, is used for both layers of floating gate material, the interface between both floating gate layers is for example visible by transmission electron microscopy (TEM), as floating gate material grains, e.g. polysilicon grains, and their boundaries at the interface can be detected. If in-situ doped floating gate material is used, e.g. in-situ doped polysilicon, the interface between both floating gate layers is visible, because part of the floating gate layer which has been deposited first, is oxidized during a liner oxidation for repairing the damage caused by the trench etch. This oxidation step forms an isolation trench covering film, e.g. consisting of silicon oxide, at the inner walls of the trench, and thus also at the free surfaces of the first floating gate layer. The second layer of floating gate material, however, does not have such liner oxide at its side, so it can be seen in the finished device that only part of the complete floating gate height is covered with such liner oxide.

The present invention furthermore provides a non-volatile memory including a semiconductor device according to the present invention and as explained above. The memory may for example be a flash memory or an EEPROM.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
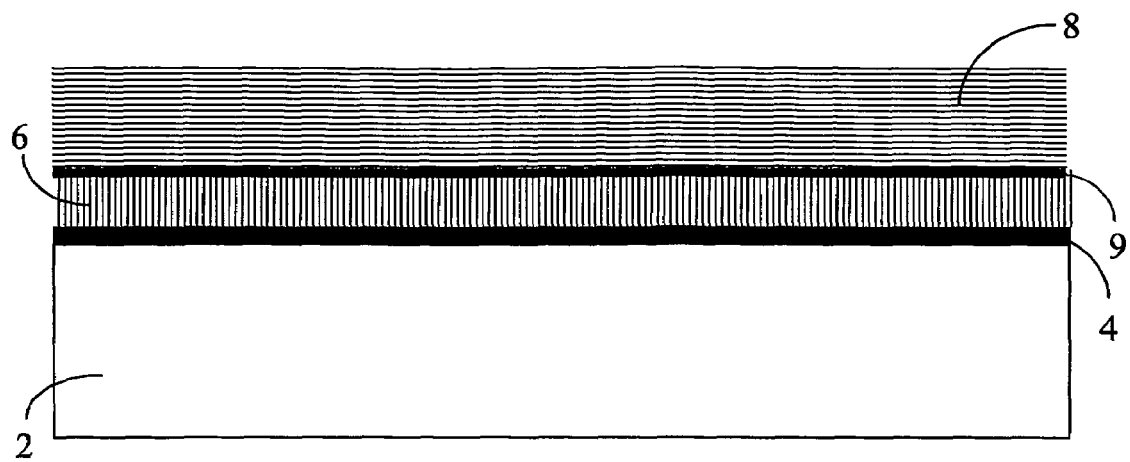
FIG. 1 is a schematic cross-section of a semiconductor substrate onto which a stack of a tunnel insulating film, a first layer of floating gate material and a layer of sacrificial material have been formed.

In the different figures, the same reference figures refer to the same or analogous elements.

The present invention will be described with respect to particular embodiments and with reference to certain drawings but the invention is not limited thereto. The invention is defined by the appended claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

According to the present invention, in a first step, a substrate 2 or a well in a substrate is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following, processing will mainly be described with reference to silicon processing but the skilled person will appreciate that the present invention may be implemented based on other semiconductor material systems and that the skilled person can select suitable materials as equivalents of the dielectric and conductive materials described below.

As shown in FIG. 1, on top of the substrate 2, e.g. a silicon substrate, a tunnel insulating layer 4 or tunnel oxide layer, e.g. comprising silicon dioxide, is formed, preferably by thermally growing it in an oxygen-steam ambient, at a temperature between about 600 and 1000° C., to a thickness between about 6 and 15 nm. Alternatively Rapid Thermal Oxidation (RTO) with in-situ steam generation (ISSG) can be used to obtain the tunnel oxide layer 4.

On top of the tunnel insulating layer 4, a first floating gate layer 6, e.g. a polysilicon layer, which is a thin layer, e.g. with a thickness of about 50 nm and in any case thinner than the total thickness of the floating gate 24 to be formed, is deposited. This first floating gate layer 6 will later on form, together with a second floating gate layer 22, the FG 24. If the first floating gate layer 6 is a polysilicon layer, the deposition thereof is preferably done by a CVD procedure. Doping of the polysilicon layer 6 is either accomplished in situ, during deposition, e.g. via the addition of arsine or phosphine to a silane ambient, or via an ion implantation procedure, using for example arsenic, phosphorous or boron ions applied to an intrinsic polysilicon layer.

On top of the first floating gate layer 6, a sacrificial layer 8 is formed, for example consisting of an insulating layer such as a nitride layer, $SiO_2$, or a silicon carbide layer. Other materials can also be used for the sacrificial layer 8, but they are often not easy to incorporate in standard semiconductor processing. The thickness of this sacrificial layer 8 is such that the thickness of this layer 8, together with the thickness of the first floating gate layer 6, substantially equals the thickness of the floating gate 24 to be formed. The thickness of the sacrificial layer 8 may for example be about 100 nm.

In between the sacrificial layer 8 and the first floating gate layer 6, an optional protection layer 9, such as e.g. a thin oxide layer, can be formed, grown or deposited. This protection layer will protect the floating gate layer 6 during removal of the sacrificial layer 8 later in the process, especially in the case of a wet etch. This extra layer is removed at the same time as the cap 14 (see below) formed by the sacrificial layer 8.

Figure 2:
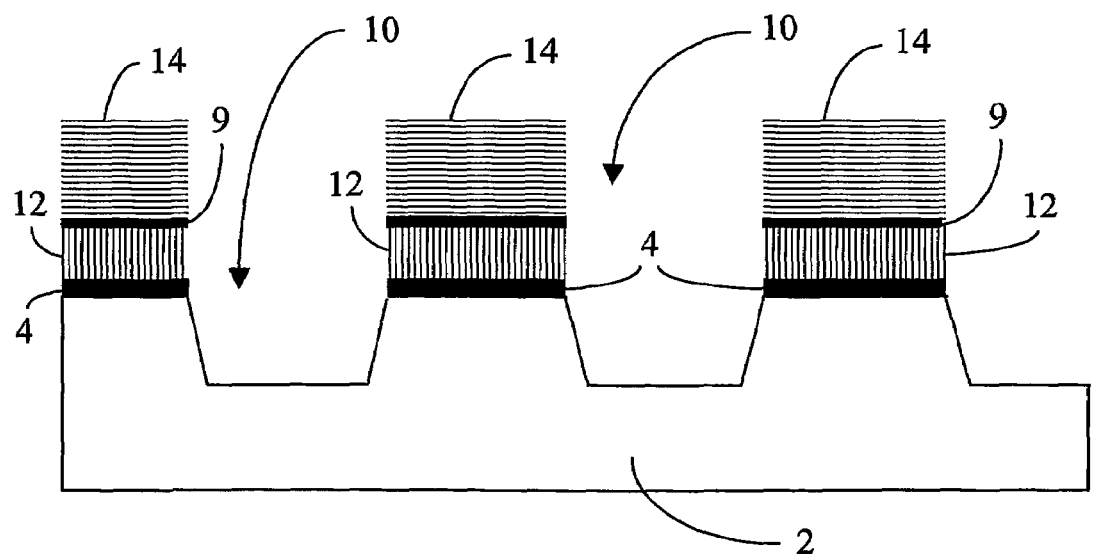
FIG. 2 is a schematic cross-section as in FIG. 1 after trench etch.

A mask (not represented) is applied on top of the stack, which defines the active, floating gate and isolation areas. The sacrificial layer 8, first floating gate layer 6, tunnel insulating layer 4 and a trench 10 in the substrate 2 are etched in subsequent etching steps. The result after this etch, and after removal of any remaining parts of the mask, if present, is shown in FIG. 2. First portions 12 of the floating gate have been formed, on top of which caps 14 formed out of the sacrificial layer 8 are present. If the mask has disappeared during the subsequent etching steps, the sacrificial layer 8 functions as a hard mask. It is possible to provide a mask having a thickness sufficient to only etch the sacrificial layer 8. After etching of the sacrificial layer 8, the mask may be removed, i.e. e.g. remaining resist may be stripped before carrying out a subsequent etching step.

Because the floating gates are self-aligned with the active region, no slits have to be etched to separate adjacent floating gates and therefore the width of the STI trench 10 can be small. The associated increased active width increases the read-current of the transistor.

Next a liner oxidation is carried out to repair the damage caused by the trench etch. This may be done by carrying out a heat treatment in a nitrogen atmosphere followed by a thermal oxidation. This oxidation step forms an isolation trench covering film (not represented), e.g. consisting of silicon oxide at the inner walls of the trench 10. It is to be noted that, at the time of the oxidation step, both the substrate 2 and the free surfaces of the first portions 12 of the floating gate are oxidized.

Figure 3:
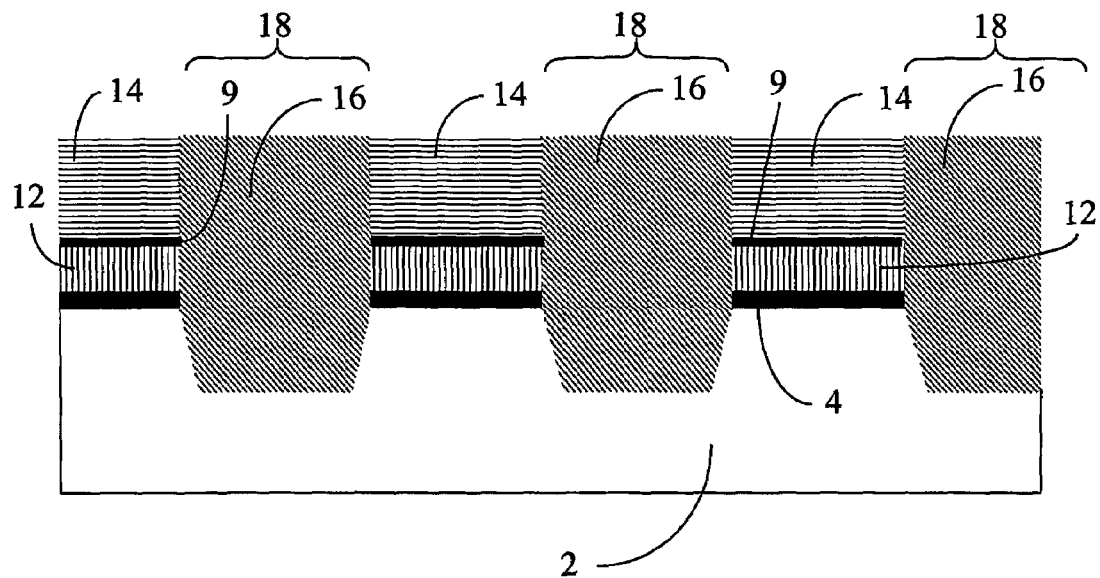
FIG. 3 is a schematic cross-section as in FIG. 2 after filling of the trench with isolating material.

After this oxidation step, the trench 10 is filled with insulating material 16 such as oxide (e.g. TEOS or HDP oxide). This insulating layer 16 may be a silicon oxide layer which is deposited, for example by a low pressure chemical vapor deposition (LPCVD) procedure or by a plasma enhanced chemical vapor deposition (PECVD) procedure, in a thickness between about 300 and 1500 nm. The shallow trenches 10 are thus completely filled. Removal of the insulating material 16, e.g. silicon oxide, from regions other than the inside of the shallow trenches 10, thus down to the top level of the caps 14 formed by the sacrificial layer 8, is accomplished using either a chemical mechanical polishing (CMP) procedure or similar process (wherein the caps 14 formed by the sacrificial layer 8 are used as a stop layer for CMP), or via a RIE procedure using a suitable etchant or similar substance, resulting in insulator filled STI regions 18 as shown in FIG. 3.

Figure 4:
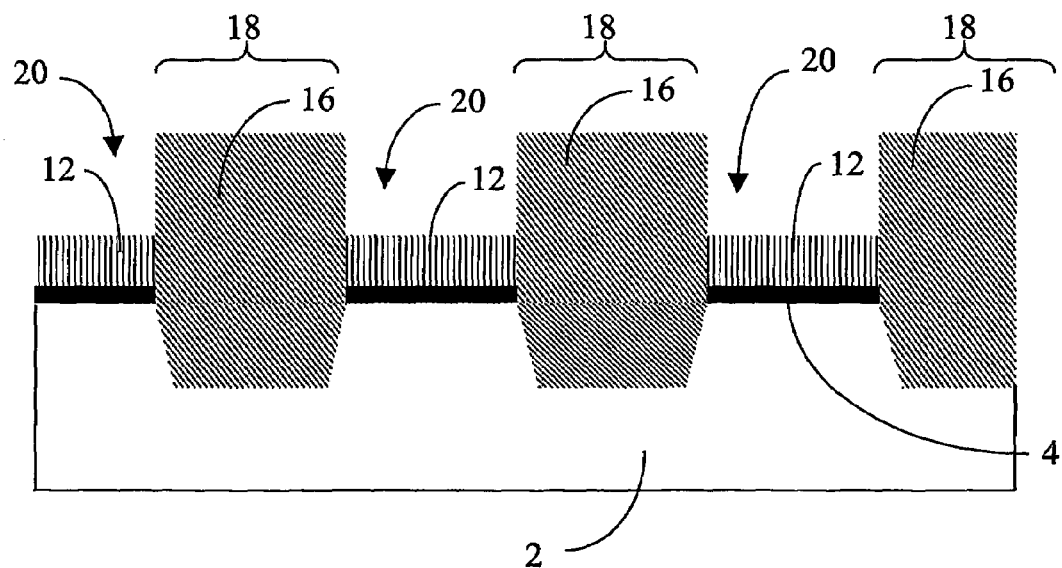
FIG. 4 is a schematic cross-section as in FIG. 3 after removal of the sacrificial material, thus forming cavities between the isolating material.

The sacrificial caps 14 on top of the first portions 12 of the floating gate are removed, e.g. etched away by either a wet or a dry etching step or similar process, thus leaving cavities 20 defined by the STI 18 and the top surface of the first portion 12 of the floating gate. Also protection layer 9 is removed, as shown in FIG. 4.

Figure 5:
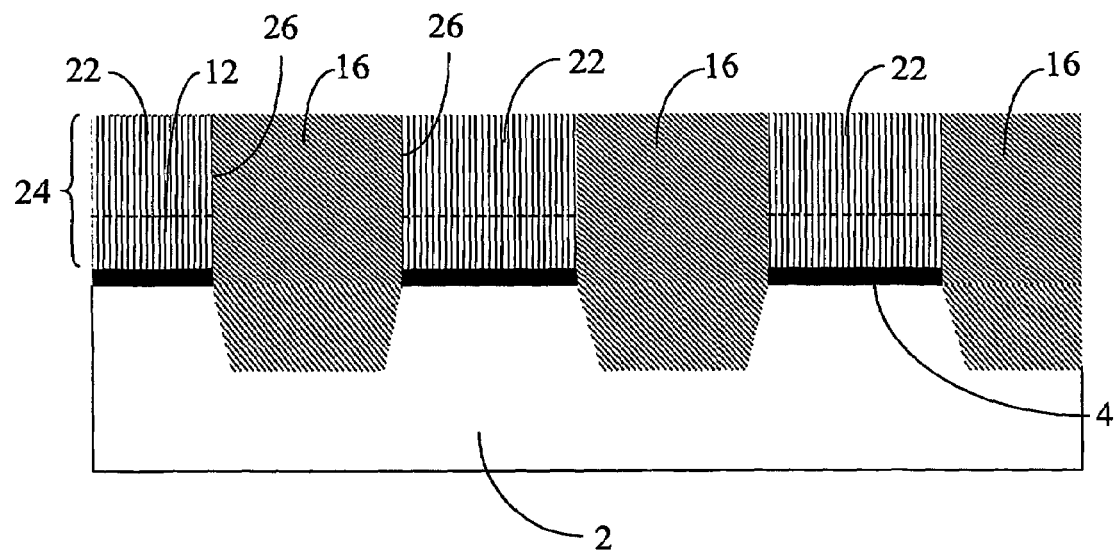
FIG. 5 is a schematic cross-section as in FIG. 4 after filling the cavities between the isolating material with floating gate material in accordance with an embodiment of the present invention.

After a cleaning step (for example a short HF dip) a second layer of FG material is formed, e.g. a second layer of polysilicon is deposited. The second layer of FG material is preferably of the same composition as the first FG layer 6. The thickness of this second layer of FG material should fill the cavities 20 between the STI insulating material 16. This second layer of FG material is removed from regions other than the inside of the cavities 20, e.g. by polishing, more specifically by CMP for example, down to the same height as the STI insulating material 16. The polishing of the second layer of FG material should stop on the STI insulating material 16. The slurry or fixed abrasives for polysilicon-CMP should be selective towards oxide. The result after removal of the second layer of FG material from regions other than the inside of the cavities 20 is shown in FIG. 5. The remaining parts 22 of the second layer of FG material form second portions of the floating gate, whereby the first portions 12 and the second portions 22 of the floating gate together form the floating gate 24.

Figure 6:
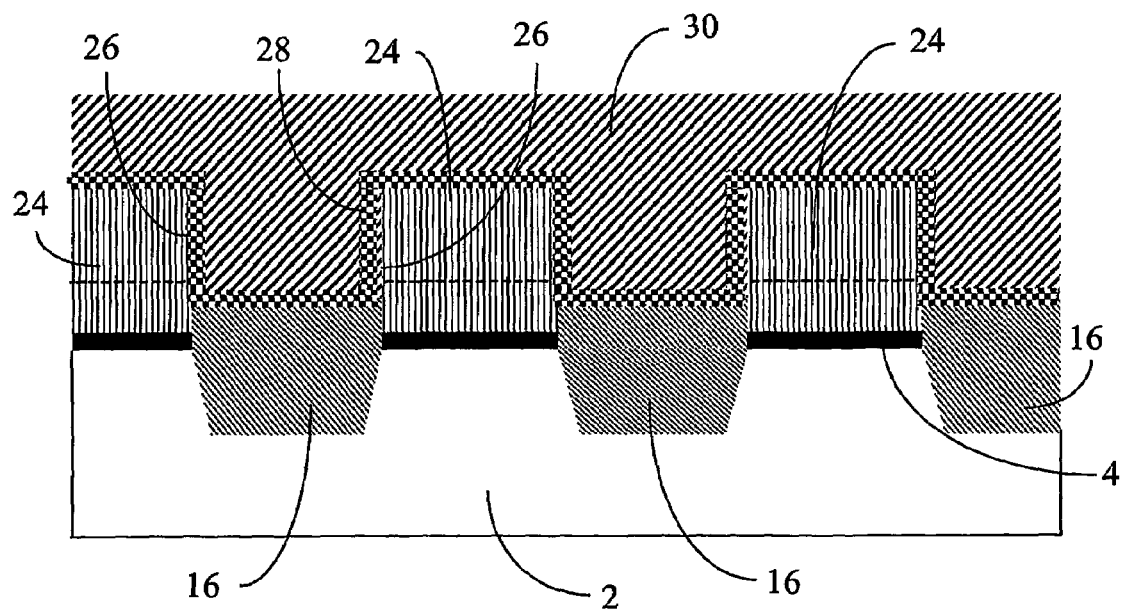
FIG. 6 is a schematic cross-section as in FIG. 5 after the partially removal of the isolating material and formation of an interlayer dielectric and the control gate material.

The STI insulating material 16 can be etched back, either wet or dry, but should remain above the bottom of the first portions 12 of the floating gate, as shown in FIG. 6. This etch uncovers part of the sidewalls 26 of the FG 24. The uncovered part of the side walls 26 of the FG 24 may be only part of the side wall of the second portion 22 of the FG 24, or the complete side wall of the second portion 22 of the FG 24, or the complete side wall of the second portion of the FG 24 and a part of the side wall of the first portion 12 of the FG 24. Exposing more of the sidewall of the FG 24 increases the coupling between FG 24 and control gate (still to be formed), because of the capacity between FG sidewall and the control gate.

Next an inter-poly dielectric 28 (IPD) is formed, as illustrated in FIG. 6. The IPD 28 preferably comprises a plurality of insulating materials, e.g. an Oxide Nitride Oxide (ONO) layer, and may be formed or grown by conventional techniques. An ONO layer preferably comprises successive layers of silicon dioxide, silicon nitride and silicon dioxide. The total dielectric thickness of the ONO layer generally is between about 10 to 50 nm.

Because the floating gate 24 has the same shape as in 'standard' non-volatile memories with STI, the IPD reliability is comparable, contrary to other designs to increase the coupling with 'self-aligned' STI, in which (extra) sharp corners are formed on the floating gate material, which degrades the reliability of the non-volatile cell.

After forming the IPD layer 28, control gate material 30, e.g. polysilicon, is deposited (preferably in situ doped), as shown in FIG. 6. The deposition of the CG polysilicon layer 30 may be done by LPCVD procedures or similar processes, in a thickness between about 50 and 400 nm. Doping of the CG layer 30 is either accomplished in situ, during deposition, via the addition of a suitable dopant impurity such as arsine or phosphine to a silane ambient, or via an ion implantation procedure, using such a dopant, e.g. arsenic, phosphorous or boron ions applied to an intrinsically polysilicon layer.

Figure 7A:
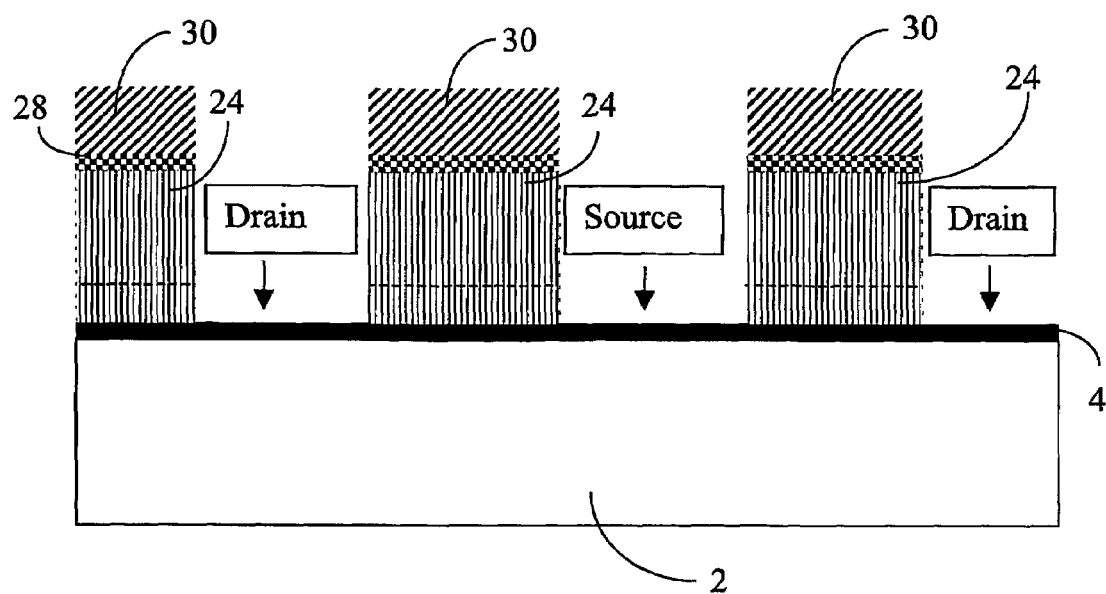
FIG. 7a and FIG. 7b are schematic cross-sections perpendicular to the direction of the cross-section shown in FIG. 6, respectively through active zones and through an isolation zone in a device according to an embodiment of the present invention.
Figure 7B:
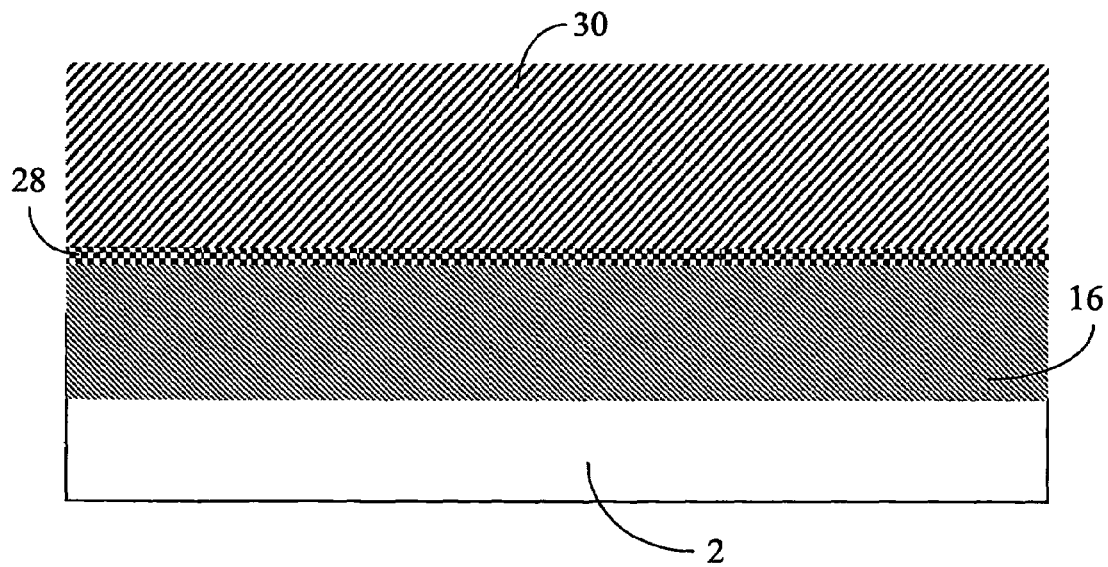

In a last step in the formation of a NVM according to the present invention, CGs are patterned. The effect of the control gate mask cannot be seen in the cross section of FIG. 6. The word lines are visible in a cross section perpendicular to the one in FIG. 6, as shown in FIG. 7a and FIG. 7b.

After this 'standard' processing as known by a person skilled in the art can be applied to finish the memory cells, such as e.g. source/drain formation, salicidation, etc.

It is to be understood that although preferred embodiments, specific materials and process steps, have been discussed herein for devices according to the present invention, various changes or modifications in form and detail may be made without departing from the scope and spirit of this invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention claimed is:

1. Method for manufacturing a floating gate type semiconductor device on a substrate having a surface, the method comprising:

forming, on the substrate surface, a stack comprising an insulating film, a first layer of floating gate material and a layer of sacrificial material, forming at least one isolation zone through the stack and into the substrate, the first layer of floating gate material thereby having a top surface and side walls, removing the sacrificial material, thus leaving a cavity defined by the isolation zones and the top surface of the first layer of floating gate material, and filling the cavity with a second layer of floating gate material having side walls, the first layer of floating gate material and the second layer of floating gate material thus forming together a floating-gate, wherein the isolation zones are removed so as to completely expose the side walls of the second layer of floating gate material and part of the side walls of the first layer of floating gate material.

2. Method for manufacturing a floating gate type semiconductor device on a substrate having a surface, the method comprising:

forming, on the substrate surface, a stack comprising an insulating film, a first layer of floating gate material and a layer of sacrificial material, forming at least one isolation zone through the stack and into the substrate, the first layer of floating gate material thereby having a top surface and side walls, removing the sacrificial material, thus leaving a cavity defined by the isolation zones and the top surface of the first layer of floating gate material, filling the cavity with a second layer of floating gate material, the first layer of floating gate material and the second layer of floating gate material thus forming together a floating-gate, and forming a protection layer between the first layer of floating gate material and the sacrificial layer.

3. Method for manufacturing a floating gate type semiconductor device on a substrate having a surface, the method comprising:

forming, on the substrate surface, a stack comprising an insulating film, a first layer of floating gate material and a layer of sacrificial material, forming at least one isolation zone through the stack and into the substrate, the first layer of floating gate material thereby having a top surface and side walls, removing the sacrificial material, thus leaving a cavity defined by the isolation zones and the top surface of the first layer of floating gate material, filling the cavity with a second layer of floating gate material having sidewalls, the first layer of floating gate material and the second layer of floating gate material thus forming together a floating-gate, partially removing the isolation zones so as to completely expose the side walls of the second layer of floating gate material and to partially expose the side walls of the first layer of floating gate material, and forming a protection layer between the first layer of floating gate material and the sacrificial layer.

* * * * *